United States Patent [19]

McCutcheon et al.

[11] 4,000,439
[45] Dec. 28, 1976

[54] TIME BASE AND DELAY CONTROL

[75] Inventors: Samuel R. McCutcheon, Saratoga; Jeffrey T. Lum, Palo Alto; Auber G. Ryals, Santa Clara, all of Calif.

[73] Assignee: Autek Systems Corporation, Sunnyvale, Calif.

[22] Filed: July 17, 1975

[21] Appl. No.: 596,712

[52] U.S. Cl. .............................. 315/367; 324/77 R
[51] Int. Cl.² .................... H01J 29/70; H01J 29/72
[58] Field of Search ......... 315/364, 367; 324/77 R, 324/77 H

[56] References Cited
UNITED STATES PATENTS

| | | | |
|---|---|---|---|
| 3,557,354 | 1/1971 | Trimble | 324/77 R |
| 3,626,168 | 12/1971 | Norsworthy | 324/77 R |

Primary Examiner—Richard A. Farley
Assistant Examiner—T. M. Blum
Attorney, Agent, or Firm—Blakely, Sokoloff, Taylor & Zafman

[57] ABSTRACT

A display control circuit for automatically displaying a sampled test signal on a CRT display, or the like, where the test signal is received at an unknown period following a trigger. The circuit first establishes a base line referenced level, then the sampling of the test signal is controlled by a varied pedestal voltage or counter potential until the magnitude of the sampled test signal exceeds the base line reference level by a predetermined potential. The pedestal voltage or counter potential required to establish this predetermined potential is used for delaying the start of the display sweep following the trigger.

10 Claims, 3 Drawing Figures

TIME BASE AND DELAY CONTROL

BACKGROUND OF THE INVENTION

1. Field of the Invention

The invention relates to display control circuits, particularly circuits used in CRT displays, or the like.

2. Prior Art

In numerous applications such as in the testing of a variety of electrical systems, it is necessary to display a signal for visual examination or to measure characteristics of the signal on a calibrated display. For example, the signal under test (hereinafter referred to as the "test signal") may be examined to determine its rise time, decay time, width, amplitude, harmonic content or other characteristics on a cathode ray tube (CRT) or other display.

In many such testing applications a trigger pulse is generated and applied to the tester (which includes the display) prior to the time that the test signal is received by the tester. However, the period between the trigger pulse and test signal is often unknown. To display such a test signal manual switching and adjusting are required.

As will be seen, the present invention provides a system for automatically displaying a test signal without the necessity of making the manual manipulations required by the prior art. Moreover, the presently disclosed circuit operates both in a real time sample mode where each test signal may be sampled a plurality of times, and in a sampled time mode where only a single sample may be obtained from each test signal.

SUMMARY OF THE INVENTION

A circuit and system are disclosed for automatically displaying a test signal on a CRT display, or the like, where the test signal is applied to the display following a trigger, but where the time interval between the trigger and test signal is unknown. First, the circuit establishes a test signal base line reference level. In the real time sample mode, a first counter activated by the trigger counts while the input is sensed and compared with the base line reference level. When the input to the circuit exceeds the base line reference level by a predetermined potential, the counter is stopped. When the test signal is displayed the sweep signal is delayed after a trigger until the contents of a second counter (activated by the trigger) are equal to the stored contents of the first counter.

In the sampled time mode the trigger is used to enable the generation of a ramp signal (fast ramp). The fast ramp is compared with a second ramp signal (slow ramp) to generate strobe signals used for sampling the input. A pedestal voltage, summed with the slow ramp, is increased until the amplitude of the sampled test signal exceeds the predetermined reference level. The pedestal voltage required to achieve this condition is stored and used to generate subsequent strobe signals for sampling the input test signal.

DETAILED DESCRIPTION OF THE INVENTION

A circuit and system is disclosed which enables a test signal to be displayed on a cathode ray tube (CRT) display, or other display means, or to be otherwise located, where the test signal follows a trigger by some unknown period of time. As will be appreciated, some of the specific details disclosed in this application such as specific voltages, scale factors, and other details of the invention have been provided for purposes of explanation, however, such specific details are not necessary for implementing the invented circuit and system.

Figure 1:
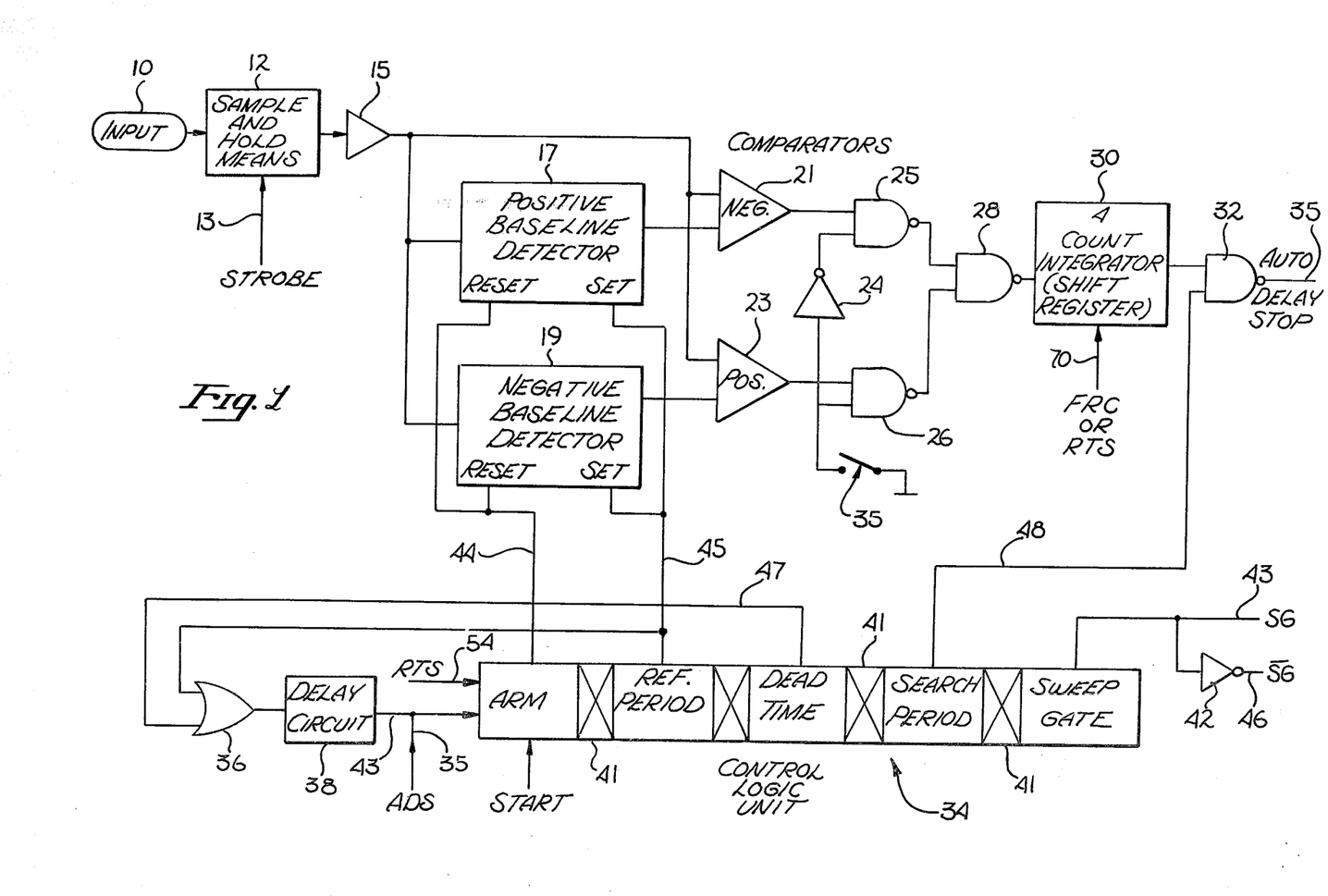
FIG. 1 is a block diagram illustrating the control logic unit and the comparator circuitry used both in the real time sample mode and sampled time mode.

Referring first to FIG. 1 the control logic unit 34 includes an input line 43 used to increment the unit, and numerous output lines such as lines 44 and 45. The logic unit 34 may be a register or other memory means, or stepping means for indicating a particular state. In FIG. 1 the various states of the unit are shown within the logic unit 34 as "arm", "reference period", "dead time", "search period", and "sweep gate". Between each of these periods or logic states a down-time signal (terminal 41) occurs; the down-time is very short in duration. The logic unit 34 increments from the period to the next (through a down-time) each time a signal is present on both lines 43 and 54. A separate single-shot-multi-vibrator, or the like, (not illustrated) is used to cause the logic unit 34 to change from the arm period to the reference period. Thus in operation, after a start signal has been applied to the unit 34, unit 34 remains in the arm period for approximately ten micro seconds before incrementing to the reference period. During each of the periods of unit 34, the unit generates a corresponding signal; specifically the unit generates an arm signal during the arm period on line 44, a signal on line 45 during the reference period, a dead time signal on line 47, a search period signal on line 48 and a sweep gate signal on line 43.

The arm period signal is coupled through line 44 to the reset terminals of a positive base line detector 17 and a negative base line detector 19. The reference period signal is carried on line 45 to the set terminals of detectors 17 and 19, and also to one input terminal of OR gate 36. The other input terminal of OR gate 36 receives the dead time signal from the control unit 34. The search period signal line 48 is coupled to one input terminal of NAND gate 32, one input terminal of AND gate 67 (FIG. 2), to a preset terminal of counter 68 (FIG. 2), and to one input terminal of AND gate 82 (FIG. 3). The sweep gate (SG) signal (line 43) is applied to the input terminal of inverter 42, one input terminal of AND gate 60 (FIG. 2), and one input terminal of AND gate 78 (FIG. 3). The down time signal, terminal 41, is coupled to one terminal of counter 68 (FIG. 2), to one terminal of delay counter 93 (FIG. 3), and to one terminal of counter 95 (FIG 3).

The inverter 42 is used to generate the $\overline{SG}$ signal (not sweep gate) on line 46; this line is coupled to the reset terminal of latch 87 (FIG. 3).

The output of OR gate 36 is delayed by delay circuit 38 before being applied to line 43. In the presently preferred embodiment the delay circuit 38 comprises a single shot multivibrator which provides a three microsecond delay.

As is apparent the control logic unit 34 and related gates may be fabricated from commercially available parts utilizing known circuit designs and techniques.

An explanation of the operation of control logic unit 34 shall be given in detail in conjunction with the explanation of the real time mode and sampled time mode circuits. However, a very brief explanation will be of assistance in understanding the function of the various blocks as they are described. Briefly the arm period is used to reset counters and to reset the base line detector 17 and 19. During the reference period, the base line reference level (of the input) is sensed and stored within detectors 17 and 19. The dead time period is used to allow the various components in the system to "settle" or to reach a steady state condition. During the search period, the input or test signal is sample for purposes of determining the duration between the trigger and the test signal for the real time sample and for establishing the pedestal potential for the sampled time mode. The sweep gate signal indicates that the input signal or test signal may be displayed, that is, the measurements and comparisons required to compensate for the time period between the trigger and test signal have been completed.

The circuitry in FIG. 1, other than that involved with the operation of the control unit 34, is common to both the real time sample mode and sampled time mode of operation, and includes an input terminal 10 for receiving the input or test signal, and an output line 35 at the output of NOR gate 32. The signal on line 35 designated as the "auto delay stop" signal is applied to line 43 of unit 34 and causes the search period to end, and the sweep gate period to begin.

The sample-and-hold means 12 has its input terminal coupled to input terminal 10, and its output terminal coupled to the input of a buffer amplifier 15. The sample-and-hold means 12 is controlled by a storbe signal applied to this means on line 13. The output of the buffer amplifier 15 is coupled to the input terminals of the positive base line detector 17, and the negative base line detector 19, and also to input terminals of the negative comparator 21 and positive comparator 23.

The positive detector 17 includes a capacitor which is charged negatively during the arm period, that is, when a signal is applied to the reset terminal of detector 17. The positive position of the output from amplifier 15 discharges the negatively charged capacitor within the detector 17 to establish a level on the capacitor, which level is fixed or stored when a signal is applied to the set terminal of detector 17. In the presently preferred embodiment, the output of detector 17 comprises the potential on the capacitor minus the potential of approximately 0.7 volts. This resultant potential is applied to an input terminal of negative comparator 21. In a similar manner the negative base line detector 19 includes a capacitor which is positively charged during the arm period, and then senses the negative portion of the signal at the output of amplifier 15. The output of detector 19 includes the stored potential on the capacitor plus a potential of approximately 0.7 volts.

Comparator 21 compares the two potentials applied to its input terminals and produces an output signal on its output terminal when the potentials are equal. The output of the negative comparator 21 is coupled to an input terminal of NAND gate 25. Similarly the positive comparator 23 produces an output on its output terminal, which terminal is coupled to an input terminal of NAND gate 26, when the signals applied to the input terminals of comparator 23 are equal.

The other input terminal of NAND gate 25 is coupled to the output terminal of an inverter 24; the input of inverter 24 is coupled to a manual switch 35 and to the other input terminal of NAND gate 26. The manual switch 35 is used for selectively applying a potential to NAND gate 26 and inverter 24; as will be seen swtich 35 is used for lockingout either the negative comparator 21 or the positive comparator 23.

The output of NAND gates 25 and 26 are coupled to the input terminals of NAND gate 28. The output of NAND gate 28 is coupled to a four-count integrator which in the presently preferred embodiment comprises a shift register. The locking signal for the shift register of integrator 30, line 70, is the fast ramp clock signal (line 69 of FIG. 2) during the sampled time mode and the real time clock (line 83 of FIG. 3) during the real time sample mode. The four count integrator 30 is used as a polling circuit, to assure that the output of NAND gate 28 is positive for four consecutive clock signals (line 70) before an output signal appears at the output of integrator 30, thus preventing noise signals from being applied to an input terminal of NAND gate 32.

Sample and hold means 12, buffer amplifier 15, detectors 17 and 19, comparators 21 and 23 and the remaining circuit elements of FIG. 1 may be fabricated from commercially available components utilizing known circuit designs.

Figure 2:
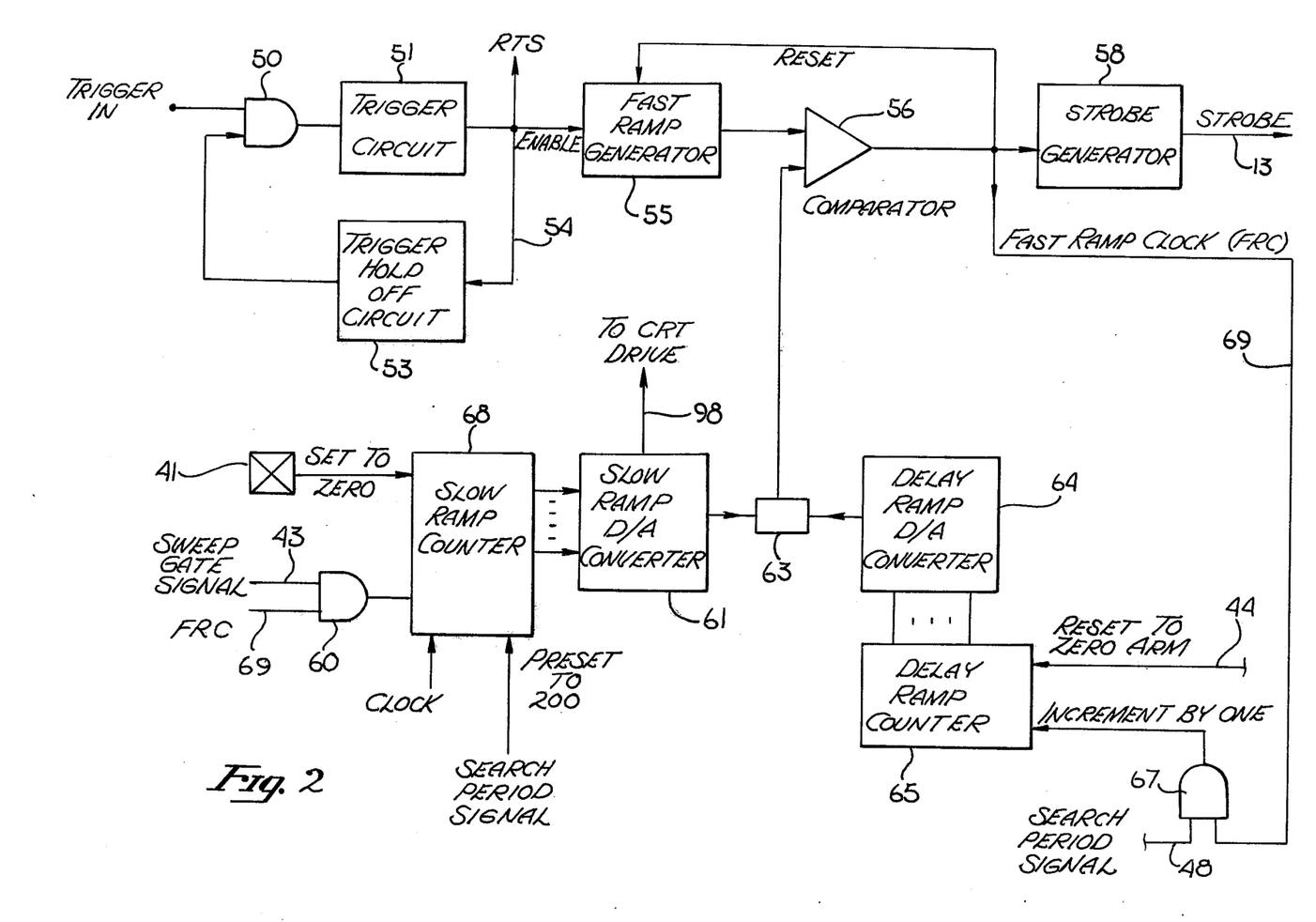
FIG. 2 is a block diagram illustrating the circuit used for the sampled time mode.
Figure 3:
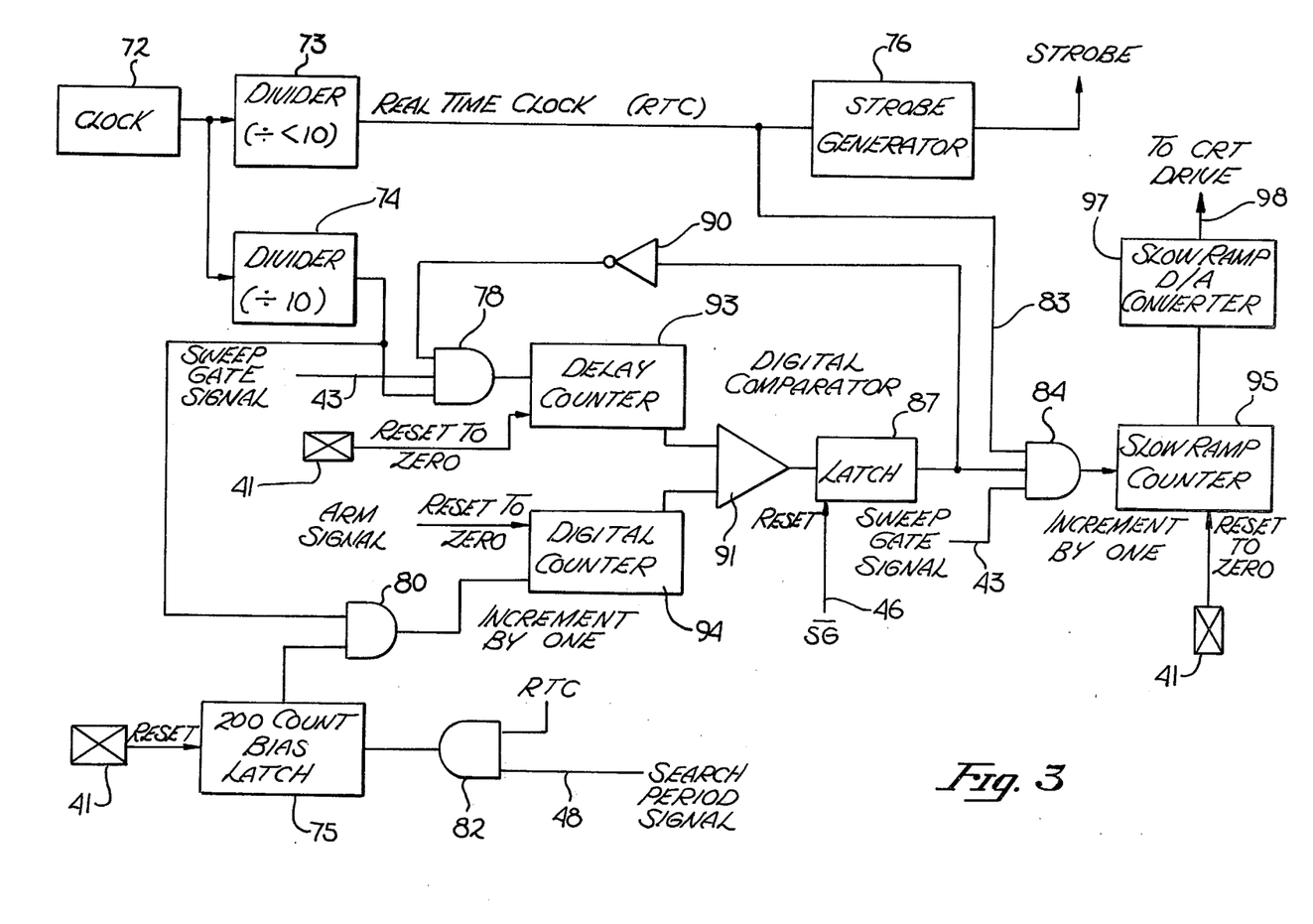
FIG. 3 is a block diagram illustrating the circuit used for the real time sample mode.

Referring now to FIG. 2 (sampled time mode circuit) one input terminal of an AND gate 50 receives the input trigger; the output of AND gate 50 is coupled to the input terminal of a trigger circuit 51. This circuit is used for generating a real time synchronization signal on line 54. The RTS signal enables the fast ramp generator 55, and is thus coupled to the input terminal of generator 55; also, this signal is used to synchronize the incrementing of control logic unit 34 of FIG. 1. Line 54 is also coupled to the trigger hold-off circuit 53 which in the presently preferred embodiment comprises a single shot multivibrator. The output of circuit 53 is applied to the other input terminal of AND gate 50. The circuit 53 and AND gate 50 provide a lockout means preventing any inputs from being applied to the fast ramp generator 55 for a predetermined period of time after a trigger has been received by AND gate 50.

The fast ramp generator 55 generates a sawtoothlike waveform which is applied to one input terminal of the comparator 56. The other input terminal of comparator 56 is coupled to a summing junction 63. The output of comparator 56, the fast ramp clock (FRC) signal, line 69, is coupled to strobe generator 58, input terminals of AND gates 60 and 67 and to the reset terminal of generator 55. This signal is used to trigger the strobe generator 58 and to reset the fast ramp generator 55 such that a new ramp will be generated by generator 55 upon receipt of the RTS signal. The strobe generator 58 generates a strobe signal, which signal is applied to the sampling-and-hold means 12 of FIG. 1 on line 13.

The gates, trigger circuit 51, circuit 53, generators 55 and 58 and comparator 56 may be fabricated from commercially available components utilizing known circuit designs.

Counter 68, which may be an ordinary digital counter, is preset to a count of 200 by the search period signal, and increments by a count of one when a signal is present at the output of AND gate 60. The counter 68 also is reset to zero during each down-time and hence is coupled to terminal 41 of unit 34 of FIG. 1. The digital count output of counter 68 is applied to the slow ramp digital-to-analog converter 61. Within converter 61 the digital signal is converted to analog form and the resultant analog signal is applied to the CRT drive line 98, and also to the summing junction 63.

Delay ramp (digital) counter 65 which may be similar to counter 68 increments by one whenever a signal is present on the output of AND gate 67, and is reset to zero when the arm period signal (line 44) is present. The digital output of counter 65 is applied to the delay ramp digital-to-analog converter 64; the analog output signal of converter 64 is coupled to the summing junction 63. The counters, digital-to-analog converters and summing junction may be fabricated from commercially available components.

First the operation of the system will be examined in the sampled time mode used typically when the frequency of the test signal is relatively high compared to the sampling rate of the disclosed circuit. During this mode of operation only a single sample of the test signal is obtained for each occurrence of the test signal. It will be assumed that a count of one-thousand in the slow ramp counter 68 corresponds to a full scale deflection when that count is converted to analog form in converter 61 and coupled to the CRT display on line 98. Also, it will be assumed that the counter 65 may count to ten-thousand, and when this potential is converted to analog form by the delay ramp digital-to-analog converter 64 and applied to comparator 56, the resultant potential will be approximately equal to the maximum potential generated by the fast ramp generator 55.

Very briefly the system operates by slowly increasing the potential applied to comparator 56 from summing junction 63 during the search period. This is done by incrementing counter 65. By slowly increasing this potential (pedestal potential) the time at which an output occurs from comparator 56 is slowly advanced, since the pedestal potential, in effect, crosses the fast ramp generator output at a higher potential, which corresponds to a later time. The pedestal potential is increased until one of the comparators 21 and 23 produces an output. This output indicates that the test signal has been located. The then exiting count in the delay ramp counter 65 remains within the counter and is used for sampling the input signal when the signal is displayed.

Referring to FIGS. 1 and 2, assume that a test signal is applied to terminal 10 and the trigger signal is applied to one terminal of AND gate 50. When a start signal is received by the control logic unit 34, an arm signal appears on line 44 allowing detectors 17 and 19 to reset, that is, for the capacitor within positive detector 17 to charge negatively, and the capacitor within detector 19 to charge positively. The arm signal also resets the delay ramp counter 65 to zero. As mentioned the single shot multivibrator incorporated within the control unit 34 automatically causes the control logic unit to move from the arm period to the reference period. In incrementing from the arm period to the reference period, the down time signal occurs causing the slow ramp counter 68 to be reset to zero.

During the reference period, the signal applied to line 45 causes the positive base line detector 17 and the negative base line detector 19 to sense the input signal. Also during this period of time the triggers applied to AND gate 50 cause the fast ramp generator 55 to generate its saw tooth ramps, and since both counter 65 and 68 are at a zero count, summing node 63 will be substantially at zero potential. The output of comparator 56 thus will occur approximately at the beginning of the fast ramp. The output of the comparator after passing through the strobe generator 58 causes the sample-and-hold means 12 to sample the input signal. However, since this sampling occurs substantially following the trigger, it is assumed that the base line of the input is sampled rather than the test signal itself. Thus detectors 17 and 19 are able to store the respective base line reference potentials. The reference period signal (line 45) activates the OR gate 36, and after the output of the OR gate 36 is delayed by circuit 38, the control logic unit 34 advances from the reference period to the dead time period. In the presently preferred embodiment, approximately ten samples of the base line are taken for purposes of establishing the reference potentials within detector 17 and 19.

The dead time period signal again activates the OR gate 36, after that signal is delayed by the delay circuit 38 the control logic unit passes from dead time to the search period. Note that the stepping of the control unit from one state to another occurs in synchronous with the RTS signal.

The search period signal is applied to the slow ramp counter 68 and presets this counter to a count of 200. A count of 200 after converted to analog form and applied to line 98 corresponds to a horizontal displacement of approximately one-fifth of the total CRT horizontal displacement. However, during the search period, the display is not necessarily activated. Since the sweep gate signal is not present on line 43, the conditions required to activate AND gate 60 are not met and the slow ramp counter 68 remains at a count of 200. The count of 200 in analog form is applied to summing node 63 through converter 61.

The search period signal when applied to one terminal of AND gate 67 will cause the delay ramp counter 65 to increment by one each time a fast ramp clock occurs on line 69. Initially the delay ramp counter 65 is at zero, and hence the contribution from the delay ramp digital-to-analog converter 64 to summing nodes 63 is substantially zero. Thus an output will occur from comparator 56 relatively early following the trigger since the fast ramp generator output will equal the relatively low potential on summing node 63 in the beginning portions of the waveform generated by generator 55. Each time comparator 56 produces an output (fast ramp clock signal) on line 69 the delay ramp counter 65 increments by one. The FRC signal also causes the strobe generator 58 to generate a strobe pulse, in turn causing the sample and hold means 12 to sample the incoming signal. Assume for sake of discussion that when the sample-and-hold means does sample the incoming signal, no signal is present, that is, the base line is again sensed, thus no output occurs from either comparator 21 or 23.

Referring briefly to FIG. 1, the closing of manual switch 35 locks out either comparator 21 or 23. Specifically if comparator 35 couples a positive potential to the input of inverter 24, the negative output of inverter 24 will prevent any signal from the negative comparator 21 from changing the state of the output from NAND gate 25. In practice the manual switch selects either a positive or negative signal, such selection may be empirically determined. Assume for sake of discussion that a positive signal has been applied to the input of inverter 24, thus allowing a signal to pass through the NAND gate 26 and effectively selecting the positive comparator 23.

Each time a trigger is received at AND gate 50, the count in counter 65 increases by a single count and the pedestal voltage generated by delay ramp digital-to-analog converter 65 increases. This causes the output of comparator 56 to occur at increasingly later times following a trigger. This counting within counter 65 continues until the signal sampled by the sample-and-hold means 12 exceeds the reference potential stored in detector 19. (This reference potential is the actually sensed base line plus 0.7 volts in the presently preferred embodiment.) The output of comparator 23 causes an output at NAND gate 28 for the selected condition of switch 35. If the output and NAND gate 28 occurs for four consecutive RTS signals, integrator 30 provides a signal to NAND gate 32. Since the other terminal of NAND gate 32 is activated by the search period signal the conditions of NAND gate 32 are met, and the automatic delay stop (ADS) signal is generated on line 35.

The ADS signal on line 35 is coupled to line 43 of the logic unit 34 and causes the logic unit to advance from the search period to the sweep gate period. In passing from the search period to the sweep gate period counter 68 is reset to zero by the down time signal, and since the search period signal is no longer present the preset count of 200 is removed from the counter 68. Since the search period signal is no longer present at the input of AND gate 67, the delay ramp counter 65 is no longer able to count, and the count required to activate the positive comparator 23 is now stored within the delay ramp counter 65.

The sweep gate signal on line 43 allows the slow ramp counter to increment each time a FRC signal occurs on line 69. The output of the counter 68 when converted to analog form and applied to line 98 causes the CRT display to sweep generally horizontally. This signal is summed in junction 63 with the output of converter 64 then applied to one input terminal of comparator 56. Each time an FRC signal occurs the slow ramp counter 68 increments by a count of one, thus causing the potential summing node 63 to increase, further causing the FRC signal and the strobe pulse to occur at a later time. In effect, what occurs, is that the stored count within counter 65 establishes a pedestal potential which allows the first sample of the test signal to occur at approximately the beginning of the test sample, and then each subsequent sample of the test signal to occur at a later period of time into the test signal.

The present count of 200 initially applied to counter 68 (during the search period) assures that the beginning of the test signal, when displayed, occurs a convenient distance from the edge of the display. As selected in the presently preferred embodiment this distance is equal to approximately one-fifth the total usable width of the display. After counter 68 reaches a count of 1000 the entire cycle may be re-started with the arm period, or with the sweepgate period.

Referring to FIG. 3, and the real time sample mode, a clock 72 is utilized for generating timing signals; its output is coupled to dividers 73 and 74. In the presently preferred embodiment, divider 73 divides the clock signal by a factor of approximately two, whereas divider 74 divides the output of clock 72 by a factor of ten. The output of divider 73 (line 83) which is coupled to a strobe generator 76, is referred to as the real time clock (RTC). Strobe generator 76 may be similar to strobe generator 58 of FIG. 2; its output is a strobe signal used to activate the sample-and-hold means 12 of FIG. 1 during the real time sample mode. The RTC signal is also coupled to one input terminal of an AND gate 84 and to one input terminal of AND gate 82.

Two counters 93 and 94 which may be ordinary digital counting means are utilized in the real time sample mode. Counter 93 is controlled by the output of divider 74 through AND gate 78. AND gate 78 receives as inputs the output of inverter 90, the output of divider 74 and the sweep gate period signal, line 43. Each time an output exists at the output of AND gate 78, the delay counter 93 increments by one count.

Counter 93 is reset to zero during dead time and thus is coupled to terminal 41. The delay counter 94 receives as an input the output of AND gate 80 and increments by one count each time a signal appears at the output of AND gate 80. AND gate 80 receives as its inputs the output of divider 74, and the output of latch 75. Latch 75 provides an output signal to an input terminal of AND gate 80 after (and only after) the latch has reached a count of 200. The latch 75 increments, by a count of one each time an output signal occurs at the output of AND gate 82. The AND gate 82 has its input terminals coupled to the source of the real time clock signal, line 83, and to the source of the search period signal. The delay counter 94 is reset to zero by the arm period signal.

The digital outputs of counters 93 and 94 are coupled to the input terminals of a digital comparator 91. Digital comparator 91 compares the digital output of counter 93 with the digital output of counter 94, and when the counts are equal provides an output signal at the output terminal of comparator 91. The output of comparator 91 is coupled to a latch 87; the latch which may be a bistable circuit has its output coupled to the input of inverter 90, and to one input terminal of AND gate 84. The latch 87 is reset by the $\overline{SG}$ signal, line 46.

The AND gate 84, in addition to having one input terminal coupled to line 83 and another coupled to the output of latch 87, has a third input terminal which is coupled to line 43, the source of the sweep gate period signal. The output of AND gate 84 is used to increment a slow ramp counter 95. Each time a signal appears on the output of gate 84 the slow ramp counter 95 increments by a count of one.

The slow ramp counter 95 of FIG. 3 may be the same counter as the slow ramp counter 68 of FIG. 2, and in fact a common counter is used in the presently preferred embodiment, however, for purposes of explanation of separate counter is shown in FIG. 3. The digital output of the slow ramp counter 95 is coupled to a slow ramp digital-to-analog converter 97; converter 97 converts the digital signal output of counter 95 to an analog signal. This analog signal is coupled to line 98, the CRT horizontal drive in the presently preferred embodiment. As was the case with the counter 95, the slow ramp digital-to-analog converter 97 may be the same converter as converter 61 of FIG. 2.

The clock 72, dividers 73 and 74, generator 76, counter 93 and 94, comparator 91, latches 75 and 87 and other circuit components of FIG. 3 may be fabricated for commercially available components using known circuit design techniques.

Referring now to FIGS. 1, 2 and 3 assume that an input or test signal is applied to terminal 10, and additionally a trigger is received by AND gate 50 of FIG. 2. During the real time sample mode the AND gate 50, trigger circuit 51 and trigger hold-off circuit 53 are operative, and the RTS signal is used to synchronize the control logic unit 34 (FIG. 1). Assuming that the real time sample mode has been selected, that the sample-and-hold means 12 of FIG. 1 is capable of sampling each test signal a plurality of times (such as a thousand times), and that the start signal has been applied to the control logic unit 34. The arm period and reference period proceed in the same manner in this mode of operation as in the sampled time mode insofar as the circuit of FIG. 1 is concerned. With reference to the circuitry of FIG. 3, it is apparent that prior to the search period counters 93 and 94, 95 will be set to zero and that latch 87 is reset so as to respond to the output of comparator 91. Assume again that an output count of one thousand from counter 95 corresponds to a full horizontal deflection for the CRT drive on line 98, and further that delay counters 93 and 94 may count to ten thousand.

When the search period begins the output of AND gate 82 begins to cause the 200 count bias latch 75 to count in synchronous with the RTC signal (line 83). Note that the beginning of the search period is synchronized with a trigger, since the RTS signal is required by the control logic unit 34 to increment to the search period. After a count of 200 has been reached the delay counter 94 begins counting since an output signal occurs at the output of AND gate 80. During this period of time counter 93 is not operative since the sweep gate period signal is not present at the input of AND gate 78. The real time clock during this period is also applied to strobe generator 76, and hence, sampling occurs within the sample-and-hold means 12. As was the case for the sampled time mode, when an output occurs from the selected comparator 21 or 23 for four consecutive RTS signals, the search period ends and the control logic unit will change from the search period into the sweep gate period. When this occurs the magnitude of the samples of test signal will be at least equal to the base line reference level (plus 0.7 volts), and the count required to achieve this will be stored in counter 94.

When the sweep gate period begins, counters 93 and 95 are reset to zero, while the count previously stored in counter 94 remains in that counter. Since the search period signal is not present, and thus no output exists at the output of AND gate 82, or at the output of latch 75, counter 94 is disabled. Counter 93 begins counting since pulses occur at the output of gate 78. When the count in counter 93 equals the count of counter 94, digital comparator 91 provides an output signal setting latch 46. When this occurs output signals synchronized with the RTC clock appear at the output of AND gate 84, allowing the slow ramp counter 95 to begin incrementing. The output of this count when converted to analog form by converter 97 is used to drive the horizontal drive of the CRT display.

The bias provided by the 200 count bias latch 75 assures that the start of the test signal on the display occurs in from the edge of the display, thus allowing the leading edge of the test signal to be observed.

In one presently preferred operating mode the pedestal voltage or count in counter 94 is re-determined after the test signal is once displayed, however this is not necessary. As presently fabricated the presently preferred embodiment is capable of determining the pedestal voltage or count, then averaging a plurality of samples of the test signal before displaying the signal.

Thus, a system and circuit has been disclosed that displays a test signal where the test signal follows a trigger by an unknown period of time. It will be apparent, however, to one skilled in the art that the system and circuit have application to display and the like, where the trigger and test signal parameters, and other parameters are different than those described herein.

We claim:
1. A control system for a display, or the like, for controlling the display of a test signal comprising:
    sample means for sampling said test signal,
    first comparator means for comparing said test signal samples with a reference level, couples to said sample means,
    drive means for driving said display; and
    second comparator means for controlling said drive means, said second comparator means including storage means for storing a signal representative of the time required for said first comparator means to respond, said second comparator means being coupled to said first comparator means and to said drive means;
    whereby said second comparator means stores a signal corresponding to the delay required for said first comparator to respond, said stored signal being utilized for controlling said display drive means.

2. The system defined by claim 1 wherein said second comparator means includes a pair of digital counter and wherein said drive means includes a third digital counter.

3. The system defined by claim 2 wherein said second comparator means includes a latch coupled to said first comparator means.

4. A control system for a display, or the like, for controlling the display of a test signal in response to a trigger comprising:
    sample means for sampling said test signal,
    first comparator means for comparing samples of said test signal with a reference level coupled to said sample means,
    first generator means for generating a first waveform said first generator means including means for receiving said trigger,
    second generator means for generating a second waveform said second generator means including storage means for storing a signal,
    second comparator means for comparing said first waveform and said second waveform, and for providing an output signal, said second comparator means being coupled to said first generator means and second generator means, and said output of said second comparator means being coupled to said second generator means and said sample means,
    drive means for driving a display, or the like, said drive means being coupled to said first comparator means,
    whereby said second generator through said second comparator means controls said sample means until said first comparator means responds, then said stored signal in said second generator means is employed to control said sample means.

5. The system defined by claim 4 wherein said second generator includes a first digital counter said first counter being incremented by the output of said second comparator means.

6. The system defined by claim 5 wherein said first waveform of said first generator comprises a ramp.

7. The system defined by claim 4 including means for selectively biasing said second comparator means.

8. The system defined by claim 6 wherein said drive means includes a second digital counter.

9. The system defined by claim 8 wherein a signal representative of the contents of said second counter is summed with a signal representative of the contents of said first counter.

10. In a display system for displaying a test signal which occurs after a trigger where said system includes a drive means for driving a CRT display, or the like, an improvement for controlling said drive means such that said test signal prominently appears on said display comprising:
sample means for sampling said test signal,
first comparator means for comparing samples of said test signal with a predetermined reference, said first comparator means being coupled to said sample means,
second comparator means for generating and storing a signal which is a function of the delay between said trigger and a response of said first comparator means, said second comparator means being coupled to said drive means and said first comparator means,
whereby said signal stored within said second comparator means controls said drive means such that said test signal is prominently displayed.

* * * * *

UNITED STATES PATENT AND TRADEMARK OFFICE
CERTIFICATE OF CORRECTION

PATENT NO. : 4,000,439
DATED : December 28, 1976
INVENTOR(S) : Samuel R. McCutcheon, et al It is certified that error appears in the above-identified patent and that said Letters Patent are hereby corrected as shown below:

Column 3, Line 32: change "storbe" to --strobe--;

Column 3, Line 39: underline the word "negatively";

Column 3, Line 51: underline the word "positively";

Column 4, Line 3: change "swtich" to --switch--;

Column 4, Line 4: change "lockingout" to --locking out--;

Column 4, Line 10: change "locking" to --clocking--;

Column 4, Line 43: change "sawtoothlike" to --sawtooth-like".

Column 7, Line 13: change "and" to --at--;

Column 7, Line 56: change "sweepgate" to --sweep-gate--;

Signed and Sealed this

Tenth Day of January 1978

[SEAL]

Attest:

RUTH C. MASON
Attesting Officer

LUTRELLE F. PARKER
Acting Commissioner of Patents and Trademark